(12) United States Patent
Ganai et al.

(10) Patent No.: US 7,743,352 B2
(45) Date of Patent: Jun. 22, 2010

(54) COMPUTER IMPLEMENTED METHOD OF HIGH-LEVEL SYNTHESIS FOR THE EFFICIENT VERIFICATION OF COMPUTER SOFTWARE

(75) Inventors: Malay Ganai, Plainsboro, NJ (US); Aarti Gupta, Princeton, NJ (US)

(73) Assignee: NEC Laboratories America, Inc., Princeton, NJ (US)

( * ) Notice: Subject to any disclaimer, the term of this patent is extended or adjusted under 35 U.S.C. 154(b) by 312 days.

(21) Appl. No.: 11/689,906

(22) Filed: Mar. 22, 2007

(65) Prior Publication Data

US 2007/0226666 A1 Sep. 27, 2007

Related U.S. Application Data

(60) Provisional application No. 60/743,648, filed on Mar. 22, 2006.

(51) Int. Cl.
*G07F 17/50* (2006.01)
(52) U.S. Cl. .................................. 716/5; 716/4
(58) Field of Classification Search ................ 716/4–5, 716/18; 703/2
See application file for complete search history.

(56) References Cited

U.S. PATENT DOCUMENTS

| | | | | |
|---|---|---|---|---|
| 6,324,678 B1 * | 11/2001 | Dangelo et al. | ............... | 716/18 |
| 6,687,882 B1 * | 2/2004 | McElvain et al. | ............... | 716/3 |
| 7,216,318 B1 * | 5/2007 | Siarkowski | .................... | 716/6 |
| 2003/0182638 A1 * | 9/2003 | Gupta et al. | .................... | 716/4 |
| 2004/0230407 A1 * | 11/2004 | Gupta et al. | ................... | 703/2 |

* cited by examiner

*Primary Examiner*—Vuthe Siek
(74) *Attorney, Agent, or Firm*—Jeffrey Brosemer; Joseph Kolodka (57) ABSTRACT

Verification friendly models for SAT-based formal verification are generated from a given high-level design wherein during construction the following guidelines are enforced: 1) No re-use of functional units and registers; 2) Minimize the use of muxes and sharing; 3) Reduce the number of control steps; 4) Avoid pipelines; 5) Chose functional units from "verification friendly" library; 6) Re-use operations; 7) Perform property-preserving slicing; 8) Support "assume" and "assert" in the language specification; and 8) Use external memory modules instead of register arrays.

7 Claims, 9 Drawing Sheets

```
char a,b,c,d ;
char e,f ;
 main(){
   char x;
   x = a + b;
   f = x d; *
    g = (b - c)*e;
}
```

| S | # Ctrl Step | # FU | MEM/ REG/ SLICE | P | # MUX | # REG | VER Result |
|---|---|---|---|---|---|---|---|
| A | 1+1R | 4 | REG | 1 | 891 | 1165 | 243s D=25 |
| B | 1+1R | 4 | SLICE | 1 | 93 | 109 | 135s D=25 |
| C | 3+1R | 2 | REG | 2 | 4398 | 5748 | 143s D=150 |
| D | 3+1R | 5 | REG | 2 | 4341 | 5748 | 52s D=150 |
| E | 1+1R | 5 | REG | 2 | 4314 | 5741 | 64s D=52 |
| F | 3+1R | 2 | MEM R1, W1 | 2 | 177 | 116 | 33s D=150 EMM |
| G | 3+1R | 5 | MEM R1, W1 | 2 | 126 | 116 | 30s D=150 EMM |
| H | 1+1R | 5 | MEM R2, W1 | 2 | 93 | 109 | 10s D=51 EMM |

COMPUTER IMPLEMENTED METHOD OF HIGH-LEVEL SYNTHESIS FOR THE EFFICIENT VERIFICATION OF COMPUTER SOFTWARE

FIELD OF THE INVENTION

This invention relates generally to the field of software development and in particular pertains to the use of High-Level Synthesis (HLS) techniques to generate models having features which facilitate more efficient verification of the software.

BACKGROUND OF THE INVENTION

As a result of the increasing design complexity and magnitude of contemporary software systems, significant efforts have been expended in design language development, high-level synthesis methodologies and verification methodologies to leverage the power of high-level models to reduce design cycle time and resulting expense. Techniques that facilitate the efficient verification of software systems during development therefore, would represent a significant advance in the art.

SUMMARY OF THE INVENTION

An advance is made to the art according to the principles of the present invention in which models that are conducive to verification ("verification aware") are generated using the existing infrastructure of High-Level Synthesis methodologies.

Viewed from a first aspect the present invention—verification friendly models (specific to SAT-based Formal Verification (FV) tools) are generated from a given high-level design: More particularly, our approach is counter-intuitive in that when constructing the model it encourages 1) No re-use of functional units and registers; 2) Minimize the use of muxes and sharing; 3) Avoid pipelines; 4) Chose functional units from "verification friendly" library; 5) Use external memory modules instead of register arrays 6) reduces control steps without re-using functional units, registers and with minimizing the use of muxes and sharing. 7) Perform property-preserving model slicing

BRIEF DESCRIPTION OF THE DRAWING

A more complete understanding of the present invention may be realized by reference to the accompanying drawings in which.

DETAILED DESCRIPTION

The following merely illustrates the principles of the invention. It will thus be appreciated that those skilled in the art will be able to devise various arrangements which, although not explicitly described or shown herein, embody the principles of the invention and are included within its spirit and scope.

Furthermore, all examples and conditional language recited herein are principally intended expressly to be only for pedagogical purposes to aid the reader in understanding the principles of the invention and the concepts contributed by the inventor(s) to furthering the art, and are to be construed as being without limitation to such specifically recited examples and conditions.

Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that the diagrams herein represent conceptual views of illustrative structures embodying the principles of the invention.

High Level Synthesis

With initial reference now to FIG. 1(a)-1(f)—and as can be readily appreciated by those skilled in the art—High level synthesis (HLS) is defined as a process of realizing a structure from a behavior description of a system. More particularly, it involves realizing a structure that implements the behavior of the system and meets a set of given constraints which typically include area, timing and power.

Generally, the structure so realized comprises 1) a datapath i.e., functional units, multiplex-ors (muxes or if-then-else), buses and storage elements; and 2) a controller which may either exhibit a microcode-based architecture or a processor-based architecture. Accordingly, and as is well-known by those skilled in the art, there is a trade-off associated with each design constraint and the HLS process has to choose the best structure—ideally exploring all possible design choices.

Automating these processes has resulted in shorter design cycles as fewer man-months are required to design systems exhibiting complex behavior when high-level languages like C and its variants i.e., SystemC (See, e.g., A. Gupta, A. A. Bayazit and Y. Mahajan, "Verification Languages," The Industrial Information Technology Handbook, 2005) are used as opposed to descriptions expressed in Register-Transfer-Level (RTL) or gate-level netlists, Advantageously, automation results in fewer design errors (modulo HLS-induced errors) and designs exhibiting improved quality i.e., meeting constraints. Those skilled in the art will appreciate that these improvements are due—in part—to a greater impact of design choices made at a higher level.

Figure 1A:
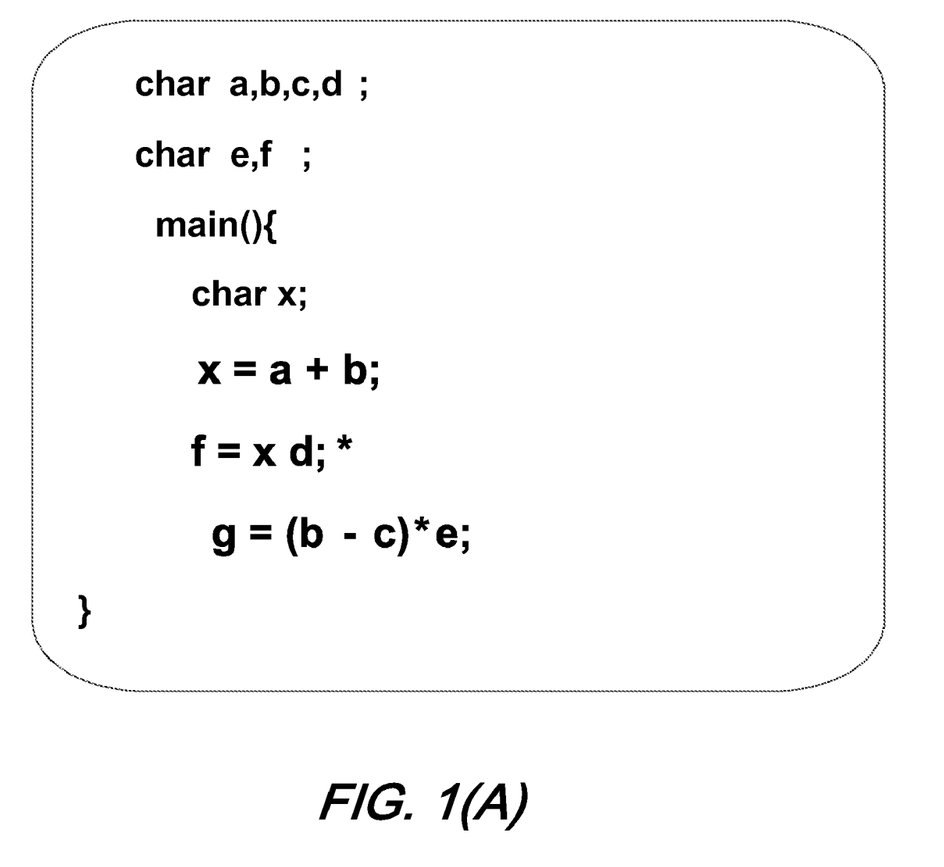
FIG. 1(a)-1(f) show the steps associated with the High-Level synthesis of 1(a) a Program written in the C programming language; (b) a data flow graph for that program; 1(c) its allocation; 1(d) its scheduling; 1(e) its binding; and 1(f) controller generation.
Figure 1B:
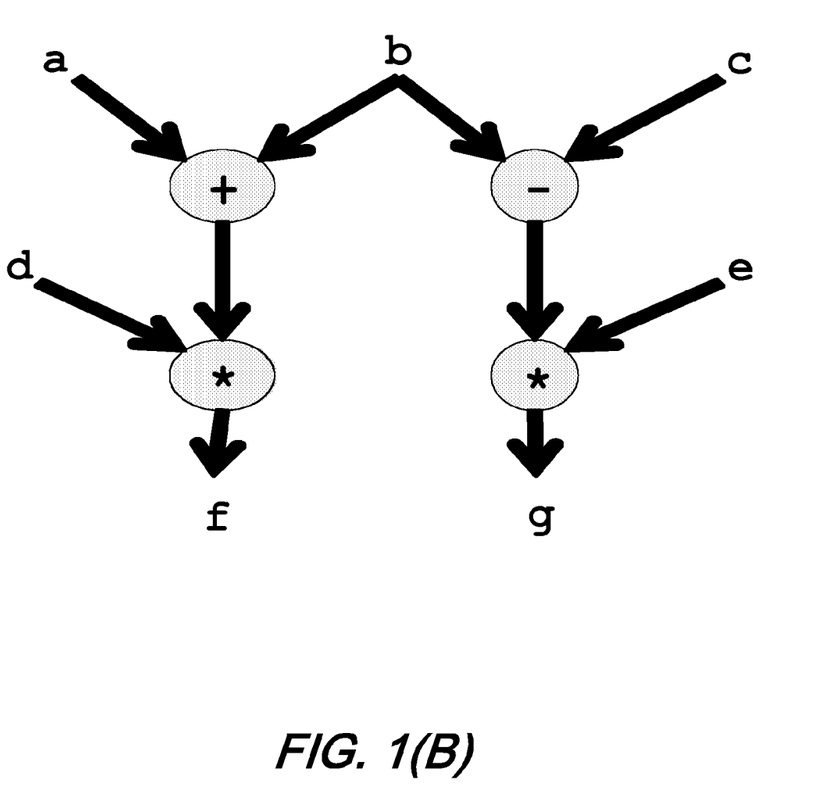

With continued reference to FIG. 1, we may now discuss the essential steps for HLS on a small example shown in that FIG. 1(a). The first step involves parsing a given specification and generating a data-flow graph such as that shown in FIG. 1(b).

As those skilled in the art will readily appreciate, the data-flow graph (DFG) represents the producer and consumer relations that exist among various operations in the program, imposed by data relations in the specification. It essentially provides the ordering among these operations which helps to re-order operations and simplify data-paths.

Given a DFG, several compiler-like local transformations are then performed. Some of them are, for example, 1) the extraction of common sub-expressions; 2) the conversion of multi-dimension arrays to a single-level array; 3) constant propagation; 4) the use of a shifter in place of constant multipliers; 5) loop unrolling, loop folding, pipelining, function inline expansion, dead code elimination and tree balancing.

Figure 1C:
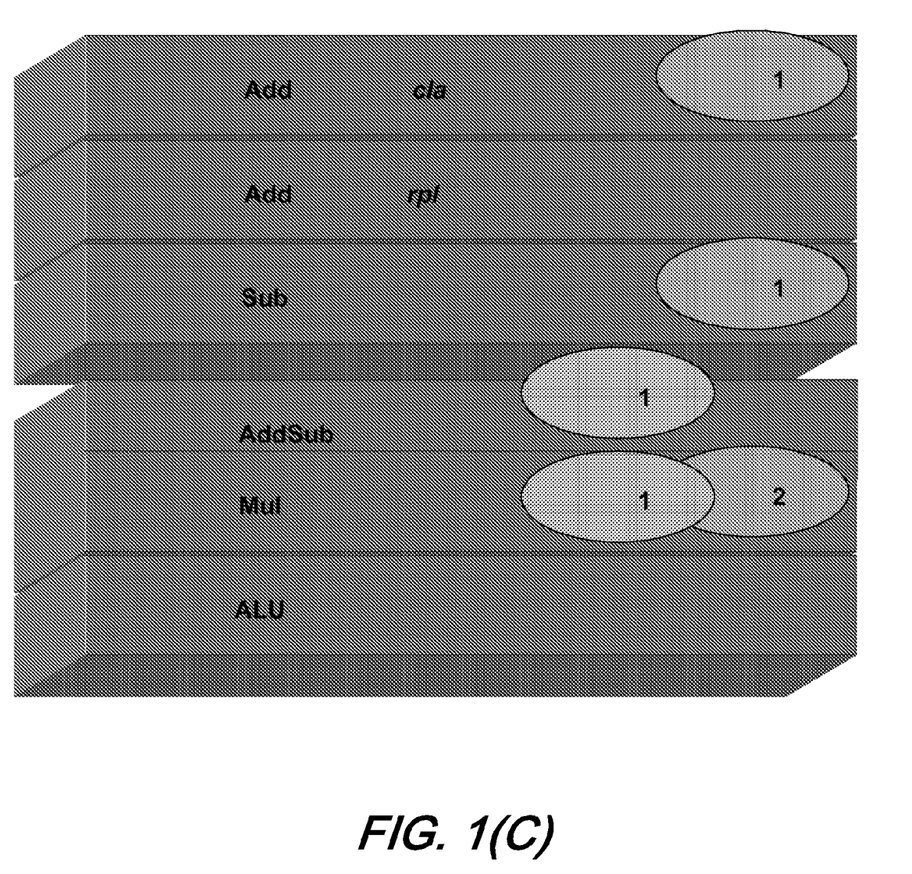

Allocation involves assigning hardware to operations i.e., allocating functional units, storage elements and communication elements to operations in order to minimize the hardware required—generally based on the cost associated with each element as shown in FIG. 1(c). For example, since mutually exclusive operations can advantageously share functional units, extracting such operations is therefore highly desirable. Similarly in memory allocation, values may be assigned to the same register as long as their lifetimes do not overlap.

Communication paths between functional units and registers are chosen so as to reduce the wiring cost and delay. However, too much sharing or communicating using multiplexers can have an undesirable effect of increased switching power requirements. Using buses instead of multiplexers reduces power and inter-connection costs but often at the cost of increased delay. The allocation step is therefore formulated as an optimization problem with various cost parameters, often resulting in a solution close to optimal.

Scheduling assigns operations to each control step corresponding to a clock cycle in synchronous systems. Typically the scheduling process is constrained by either area or performance. In an area-constrained scheduling step, one objective is to minimize the number of control steps under a given area cost and (and maybe power) as shown in FIG. 1(d).

Several techniques for example, extraction of parallelism, speculation, operation chaining and pipelining are applied to minimize the control steps. In time-constrained scheduling, the objective is to minimize the area cost of the hardware given the number of control steps (and perhaps power). This has the effect of maximizing the re-use of functional units and storage elements so as to reduce the area cost. Too much sharing can, however, increase switching activity and hence power requirements as noted before.

Figures 1D, 1E:
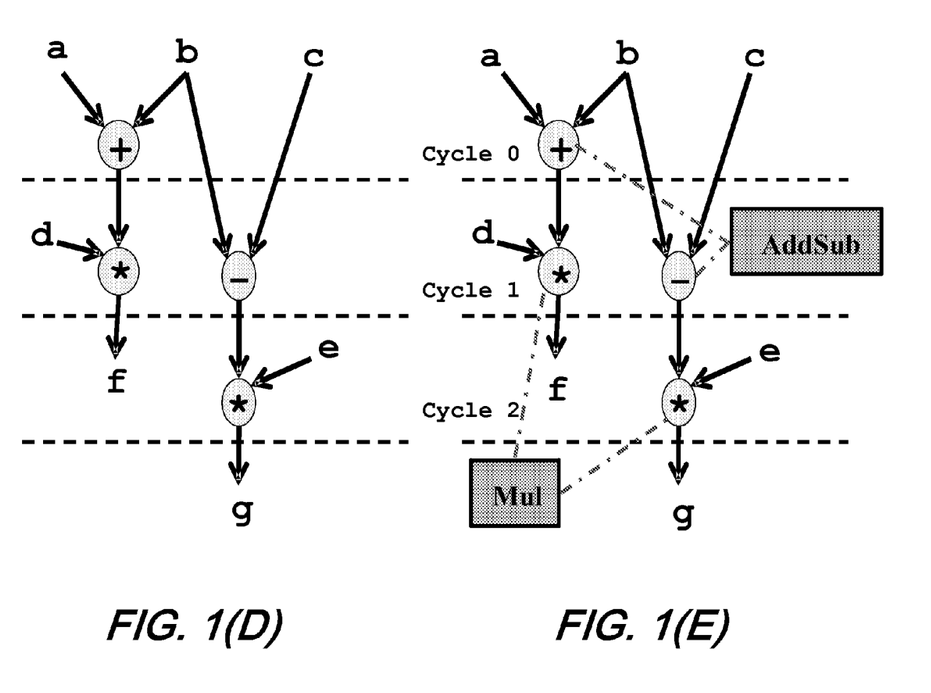

Binding refers to the process of assigning modules such as adders, arithmetic logic units (ALUs), shifters, storage elements such as registers and memories to variables and communication elements like wire, multiplexers and buses for data transfer as shown in FIG. 1(e). Each of the choices has associated area and delay trade-offs where a solution is obtained by formulating it as an optimization problem.

Figure 1F:
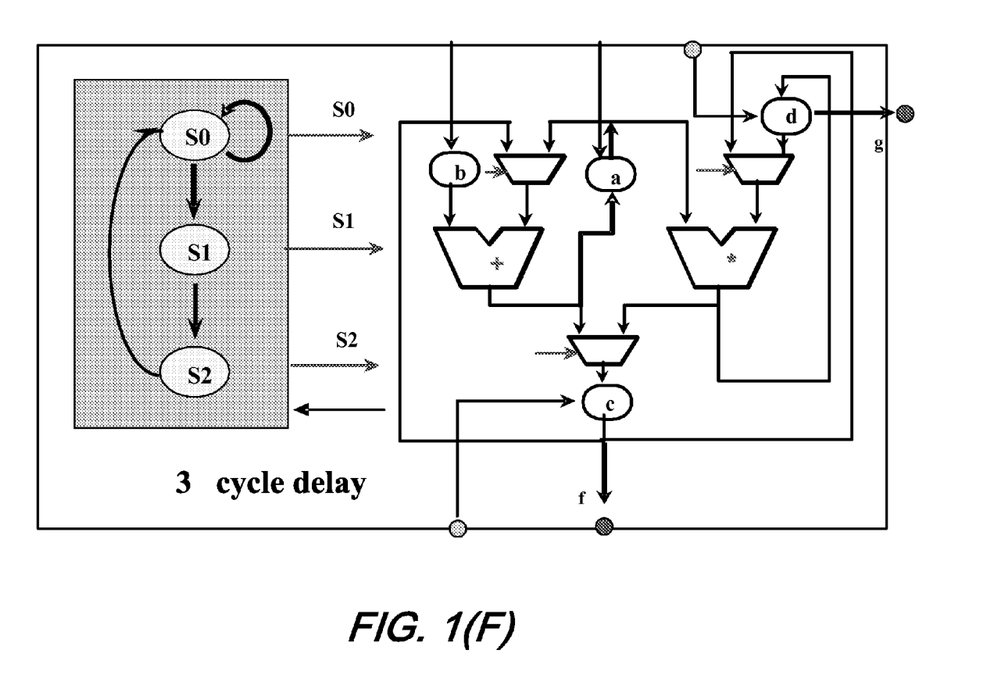

Controller synthesis refers to the generation of control signals to drive the data paths at each control step as shown in FIG. 1(f). Advantageously, the controller can be implemented using combinational logic or a microcode control based architecture.

HLS Parameters: Trade-Off

As can be appreciated by those skilled in the art, different design choices made during high level synthesis (HLS) often have conflicting impacts on area, performance and power requirements. We discuss some of these and their effects.

Number of functional units, storage elements: Increased use of functional units (FUs) can reduce the number of control steps and thereby increase the performance; however, the increased use of FUs increases the total area and power due to increased output capacitance and leakage current. On the other hand, increased sharing of FUs can result in reduced area, though at the price of increased interconnect cost, reduced throughput and increased switching power.

Number of control steps: To reduce the number of control steps and thereby increase the throughput (for a given clock frequency), it is often required to use more FUs with minimum sharing at increased area cost. Due to less sharing and hence less switching activity, the power requirement is also reduced. Additionally, for a given throughput, voltage can be scaled to further reduce the power requirement.

Speculative execution, parallelization and pipelining are typically used to increase the throughput. As is known, the area increases as more FUs are required to carry out additional executions per control step. In addition, the power tends to increase due to increased switching incurred from the additional operations.

Operation re-use refers to the sharing of operations in the control-flow graph as opposed to sharing of operators. This simplification technique is one way to decrease number of FUs requirement; thereby reducing area. Power requirement tends to decrease due to less switching activities. Throughput, however, is affected negatively as the critical length tends to increase.

Increased clock frequency improves the performance at the cost of overall area, as faster but larger FUs are typically used. Power requirement also increases as it is directly proportional to the frequency of operation.

Scaling voltage down improves power usage quadratically but increases the delay of FUs. To compensate for the delay, faster and hence larger FUs may be used at increased area cost.

SAT-Based Verification

As can certainly be appreciated by those skilled in the art, functional verification has become an important stage of a design process. Operationally, significant resources are devoted to bridge the gap between design complexity and verification efforts.

SAT-based verification techniques have shown significant potential in terms of scalability and practicality of formal methods. These verification techniques—when applied at structural Boolean levels closer to a realization—are more appealing to designers and are also quite mature as compared to higher level counterparts.

These structural Boolean level verification techniques remain indispensable for their ability to find structural bugs including those induced by HLS. A combined HLS with structural verification technique is shown schematically in FIG. 2, where an RTL design synthesized under area, performance and power constraints is verified using a model checker.

The checkers or properties needed for the model checkers are also synthesized by HLS from one of the following: 1) user-specification using formal specification languages like PSL (See, e.g., K. Wakabayashi, "Cyber: High Level Synthesis Systems from Software into ASIC," in High Level VLSI Synthesis, R. Camposano and W. Wolf, Eds., 1991, pp. 127-151; A. Gupta et al, "Verification Languages," in The Industrial Information Technology Handbook, 2005); 2) Specification primitives supported by the design languages such as System, or Verilog Assertion; or 3) automatically generated checkers corresponding to common design errors like write before read, read before initialization, full case, parallel case, memory access errors, memory out-of-bound access, unreachable branch, synchronization errors due to clock domain crossing, etc.

Figure 2:
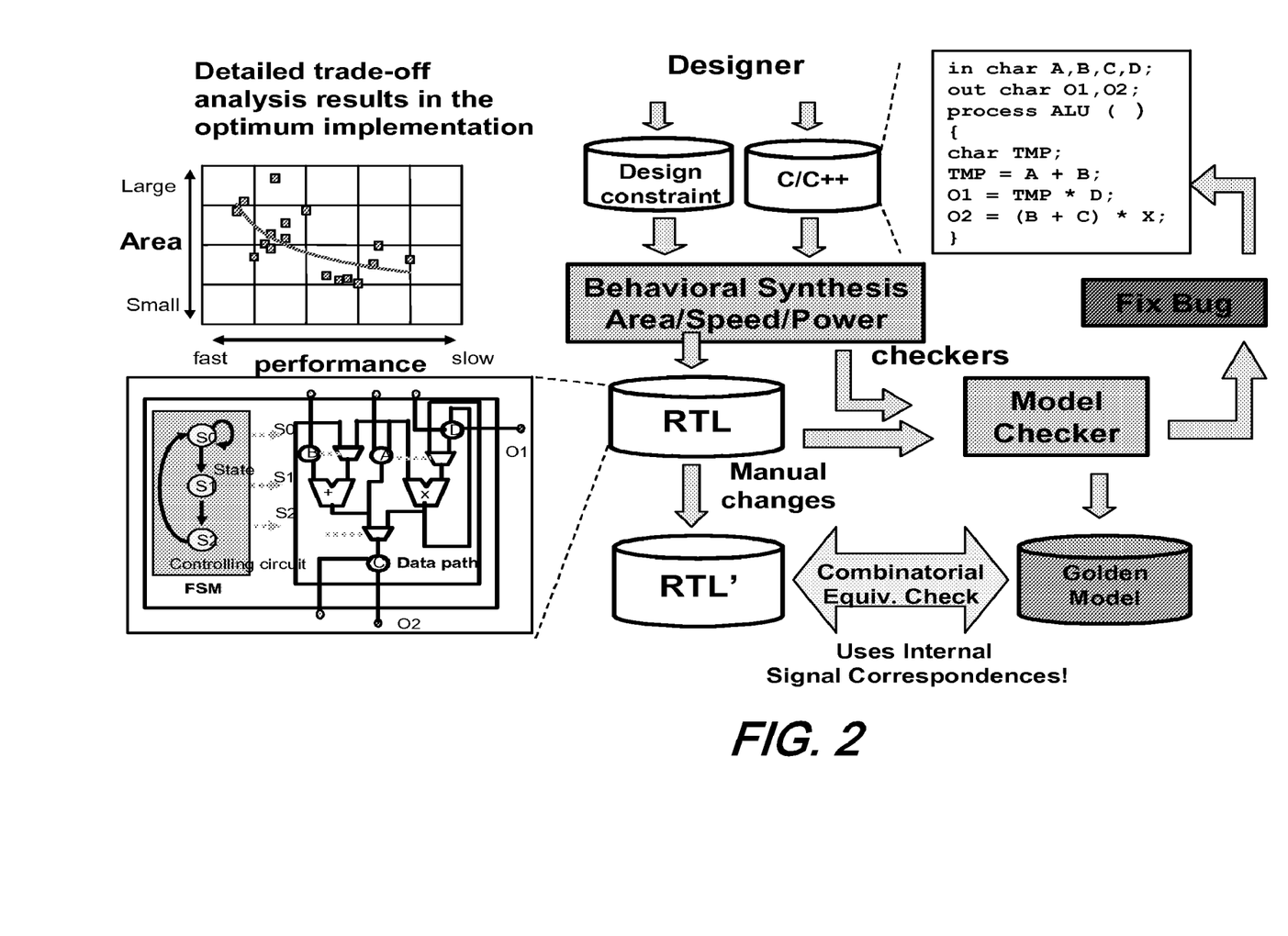
FIG. 2 is schematic diagram showing current methodology of High-Level Synthesis with verification.

The model—after being verified against the checkers to a certain level of confidence—is called a "Golden Model" and is shown schematically in FIG. 2. This Golden Model is used as a reference model for checking functional equivalence against any manually modified RTL.

We identify the strengths and weaknesses of SAT-based approaches in reference to a SAT-based Verification Tool, DiVer (See, e.g., M. Ganai et al, "DiVer: SAT-Based Model Checking Platform for Verifying Large Scale Systems", Proceeding of TACAS, 2005) We chose this tool as it provides a tightly integrated environment for various state-of-the-art SAT-based verification engines that are specialized for specific tasks like falsification, abstractions, and refinement. As is known, DiVer uses an efficient circuit representation with on the-fly simplification algorithms (See, e.g, A. Kuehlmann, et al "Circuit based Boolean Reasoning," Proceedings of Design Automation Conference, 2001; and M. Ganai et al., "On the Fly Compression of Logical Circuits," Proceedings of International Workshop on Logic Synthesis, 2000), and an incremental hybrid SAT solver (See, e.g, M. Ganai, et. al, "Combining Strengths of Circuit-Based and CNF based Algorithms for a High Performance SAT Solver," Proceedings of the Design Automation Conference, 2002) that combines the strengths of circuit-based and CNF-based solvers seamlessly.

Advantageously, DiVer houses the following SAT-based engines, each geared towards verifying large systems: bounded model checking (BMC) (See, e.g., M. Ganai, et. al, "Efficient Approaches for Bounded Model Checking," United States Patent Application 2003-0225552, filed May 30, 2002—the entire contents of which are hereby incorporated by reference) and distributed BMC (d-BMC) over a network of workstations (NOW) (See, e.g., M. Ganai, et al, "Distributed SAT and Distributed Bounded Model Checking," in Proceedings of CHARME, 2003) for falsification, proof-based iterative abstraction (PBIA) for model reduction (See, e.g., A. Gupta, et al., "Iterative Abstraction using SAT-Based BMC with Proof Analysis", Proceedings of ICCAD, 2003), SAT-based unbounded model checking (UMC) [IS] and induction for proofs [See, e.g., M. Sheeran, et. al., "Checking Safety Properties using Induction and a SAT Solver", in Proceedings of Conference on Formal Methods in Computer-Aided Design, 2000; A. Gupta, et. al., "Abstraction and Bdds Complement SAT-Based BMC in DiVer," in Computer Aided Verification, 2003, pp. 206-209), Efficient Memory Modeling (EMM) (See, e.g, M. Ganai, et. al., "Efficient Modeling of Embedded Memories in Bounded Model Checking", Proceedings of CAV, 2004) and its combination with PBIA in BMC for verifying embedded memory systems with multiple memories (with multiple ports and arbitrary initial state) and to discover irrelevant memories and ports for proving property correctness (See, e.g., A. Biere, et. al., "Symbolic Model Checking using SAT Procedures Instead of BDDs", Proceedings of the Design Automation Conference, 1999). We may now discuss the methods and their certain strengths and weaknesses.

Hybrid SAT: Hybrid SAT is a DPLL-based SAT solver that combines the strengths of circuit-based and CNF-based SAT solvers with incremental SAT solving capabilities. The solver uses deduction and diagnostics engines efficiently on a hybrid Boolean representation, i.e., circuit graph and CNF. The decision engine also benefits from both circuit and CNF based heuristics.

Strengths of Hybrid SAT: Advantageously, Hybrid SAT is good at finding partial solution(s). The search scales well with problem size and it provides incremental learning capability with low overhead, thereby improving the subsequent search. In addition, it performs well on disjoint-partitioned substructures, is a mature technology and well-know heuristics exists, and it exhibits a number of advantages over CNF/Circuit-Based Solver.

Weakness of Hybrid SAT: Unfortunately, Hybrid SAT also exhibits a number of weaknesses. More particularly, multiplexers—in general—are detrimental to DPLL-based solvers, and they are not good for problems arising from area-optimized circuits with heavy sharing of registers and FUs, and are not particularly good at enumerating solutions.

Bounded Model Checking (BMC): BMC is a model checking technique where falsification of a given property is carried out for a given sequential depth, or bound. Typically, it involves a number of distinct steps namely: 1) unrolling the Boolean model with the property for a bounded number of time frames; 2) translating the problem into a propositional formula; and 3) checking the satisfiability of the formula using a SAT-solver to check satisfiability. Advantageously, BMC sub-tasks can be distributed over network of workstations. In addition to falsification, one can use inductive reasoning with BMC to obtain proofs.

Strengths of BMC: Advantageously, BMC finds the shortest counter-example efficiently. In addition, successive problems overlap, allowing incremental formulation and incremental learning for SAT. BMC provides natural disjoint partitioning of problem; thereby allowing distributed-BMC to overcome memory requirements. Furthermore, reached states are not stored, it is less sensitive than BDDs to the number of registers required. Finally, a BMC search scales well in practice and state-of-the-art improvisation provides a mature technology.

Weakness of BMC: Unfortunately with BMC, the problem size grows linearly with the unroll depth and it is therefore quite sensitive to the size of the model. In practice, it is generally incomplete and stopping criteria is difficult to determine. Finally, it is not particularly good when controllers has large number of control states as it leads to longer search depths Proof-based Abstraction (PBA): PBA techniques (See, e.g., K. McMillan and N. Amla, "Automatic Abstraction Without Counter Examples" Tools and Algorithms for the Construction and Analysis of Systems", April 2003) generate a property preserving abstract model (up to a certain depth) by; 1) obtaining a set of: latch reasons involved in the unsatisfiability proof of a SAT problem in BMC, and, 2) by abstracting away all latches not in this set as pseudo-primary inputs. Additionally, one can further reduce the model size by using the abstraction iteratively and using lazy constraints. (See, e.g, A. Gupta, et. al., "Lazy Constraints and SAT Heuristics for Proof-based Abstraction", Proceedings of VLSI Design, 2005)

Strengths of PBA: Advantageously, PBA identifies and removes irrelevant logic and identifies irrelevant memory and access ports. In addition, it often helps derive a small abstract model on which unbounded proof or deeper bounded proof can be easily be obtained. Finally, PPA reduces the refinement requirement by eliminating all counter-example of bounded depth and uses state-of-the-art BMC engine in the backend.

Weakness of PBA: One particular weakness associated with PBA is that the sharing of FUs reduces the scope of identifying irrelevant logic. Other weaknesses that are associated with SAT-based BMC are associated with this method as well.

Efficient Memory Modeling (EMM): EMM approaches augment BMC to handle embedded memory systems (with multiple read, write ports)—without explicitly modeling each memory bit—by capturing the memory data forwarding semantics efficiently using exclusivity constraints. An arbitrary initial state of the memory is modeled precisely using constraints on the new symbolic variables introduced. Advantageously, EMM and PBA techniques can be combined to identify fewer memory modules and ports that need to be modeled, thereby reducing the model size, and verification problem complexity.

Strengths of EMM: EMM is sound and complete as it preserves the memory semantics. No examination or translation of design module is required. It advantageously reduces design size significantly as memory states are not modeled. In addition, muxes used in EMM constraints can be reduced by capturing read-write pairs exclusively and EMM constraints only grow lazily with each unroll depth. Finally, EMM is quite useful for checking behaviors that require fewer memory accesses and it works well with arbitrary or uniform memory initialization while nicely augmenting state-of-the-art BMC.

Weakness of EMM: Unfortunately, frequent memory accesses associated with EMM can be detrimental as it reduces the scope of simplification of EMM constraints. In addition, any non-uniform memory initialization increases memory cycles and sharing of FUs is detrimental as it reduces the scope of identifying irrelevant logic. Lastly, other weaknesses associated with SAT-based BMC apply to the EMM technique as well.

HLS Parameters: Impact on Verification

We note that a model generated by HLS for model checking may not be verification "friendly" as specific design choices may conflict with inherent limitations of these verification techniques. Accordingly, we now discuss how particular design choices affect SAT-based verification efforts.

Re-use of Functional Unit and Registers: Although the SAT-problem size reduces, thereby reducing the total state space, increased use of multiplexers adversely affects the performance of SAT as the partitioning of the search space has to be done dynamically by the SAT-solver.

Control Steps: Generally speaking, the reduction in control steps is useful as it reduces the search depth. However due to powerful techniques employed in BMC such as incremental learning and dynamic circuit simplification, more control steps can be useful if the functional units are not shared across the control steps.

Speculative execution and Parallelization: Strategies—such as speculative execution and parallelization—are useful when FUs and intermediate variables are not re-used. Consequently, this helps reduce the sequential depth.

Pipelines: Pipelines typically increase the verification complexity without adding any functional behaviour. As a result, pipelines should be avoided for verification purposes.

Re-use of operation: Generally, the re-use of an operation is helpful to verification as it reduces the number of operations by exploiting common sub-expressions. Advantageously, this reduces the number of FUs without sharing.

Clock/Voltage Scaling: The scaling of Clock/Voltage affects the choice of FUs and hence, number of muxes and the control depth. Typically, FUs chosen for reduced voltage exhibit a larger area and have a large number of muxes. Thus, FUs satisfying specific clock and voltage constraints may not be verification friendly if they rely on the extensive use of muxes or have larger clock cycles.

Source Code Optimization: Typically, source code optimization performed in HLS preserves substantially all the behavior(s) of the design. Unfortunately however, verification engines—and in particular those discussed previously—are specially directed towards checking only a few properties at a time. In addition, various verification tasks can be done more efficiently when using a model having a smaller size. According to the present invention, slicing away behaviors (and any elements) unrelated to the specific properties can significantly reduce the model size and thereby, improve the verification efforts. As those skilled in the art will readily appreciate, while such strategies are routinely applied to the Boolean model by considering static fanin cone analysis of the property under consideration—according to an aspect of the present invention—property-preserving slicing performed on the higher level specification carried out by HLS may advantageously lead to a greater reduction in the corresponding verification model size.

Case Studies

We may now discuss the effect of re-using functional units and registers, modeling of memories, the number of control steps, and slicing on the performance of SAT-based bounded model checking approaches. We have performed evaluations with an HLS tool Cyber, integrated with a SAT-based model checking tool, Diver. As known by those skilled in the art, these tools exhibit state-of-the-art high level synthesis and verification algorithms respectively and are widely adopted by a number of designers.

In performing our evaluations, we used a FIFO example written in a proprietary high-level language called BDL which those skilled in the art will recognize as having C-like characteristics. The FIFO is modeled as an array of address width 7 and data width 7 with a read and write pointer. To make the model more interesting, we non-deterministically chose to enqueue the write pointer value not in FIFO.

For verification purpose, we chose two properties: a) PI: FIFO gets full eventually. We chose a FIFO Length of 24, b) P2: A state is reachable eventually where the data at the beginning of the queue is 50 less than the current write pointer. We chose a FIFO length of 128. For both these properties, static cone analysis is done to derive the Boolean verification model. The results are shown in Table 1.

With reference to Table 1, columns 1-3 show synthesis results under various synthesis strategies (S) denoted by A-G, available to the HLS tool. More specifically, Column 1 shows the number of control steps (R denotes the reset state); Column 2 shows the number of different and total functional units used based on the resource available; Column 3 shows modeling and property specific slicing operation; where REG denotes the use of register file; MEM denotes the use of memory module with read ports (#R) and write ports (#W); and SLICE denotes the use of property specific slicing performed by HLS that removes the storage elements as it is not relevant to the property. Continuing, Column 4 shows the property (P) checked by verification tool; Column 5 and 6 give number of muxes and registers in the Boolean verification model derived from the synthesized design; and Column 7 gives the time taken (in sec) to find the witness for the properties on the verification model obtained from synthesized design in Column 6, and the witness length (D); EMM denote the use of efficient memory modeling in BMC.

Discussion

The synthesis strategies A and B on property 1 show that slicing away the irrelevant storage elements by HLS can effectively reduce the model size, indicated by register and mux count; which in turn improves the performance of verification tool. Strategy C on property 2 shows how increased use of muxes due to resource limitation (#FU=2) can degrade the performance of verification tool as compared to strategy D and E with #FU=5. We make an interesting observation using strategies D and E. Though the witness length and # muxes are larger using D, the time taken to find the witness is smaller compared to E. In strategy D, we forced HLS tool to use 3 control steps (in addition to the reset state) while in strategy E we let HLS tool minimize number of control steps.

The forced strategy D leads to a synthesis of a model where the operations are partitioned across various control steps and FUs binding to them are not shared. For such a model, several unrolled BMC instances can be re-solved quickly during the circuit simplification stage or the preprocessing stage of a SAT solver. In strategy F, unlike strategies C-E, HLS tool uses memory modules with one read and write port instead of register files. We see a significant reduction in the verification vmodel size. Using BMC with EMM on this model, we see a significant improvement in performance.

After increasing the resource available for HLS to #FU=5 as in strategy G, we see a predictable improvement in the performance. Using strategy H with fewer control steps and increased memory ports, we see further improvements. Unlike the strategy E, the improvements using H is attributed to the following: availability of larger number of memory access ports eliminates the reuse and hence, reduces number of muxes, and as EMM constraints grows quadratically with unrolling, reduction in sequential depth (due to fewer control steps) helps in reducing the size of the SAT problem.

Synthesis for Verification

Figure 4:
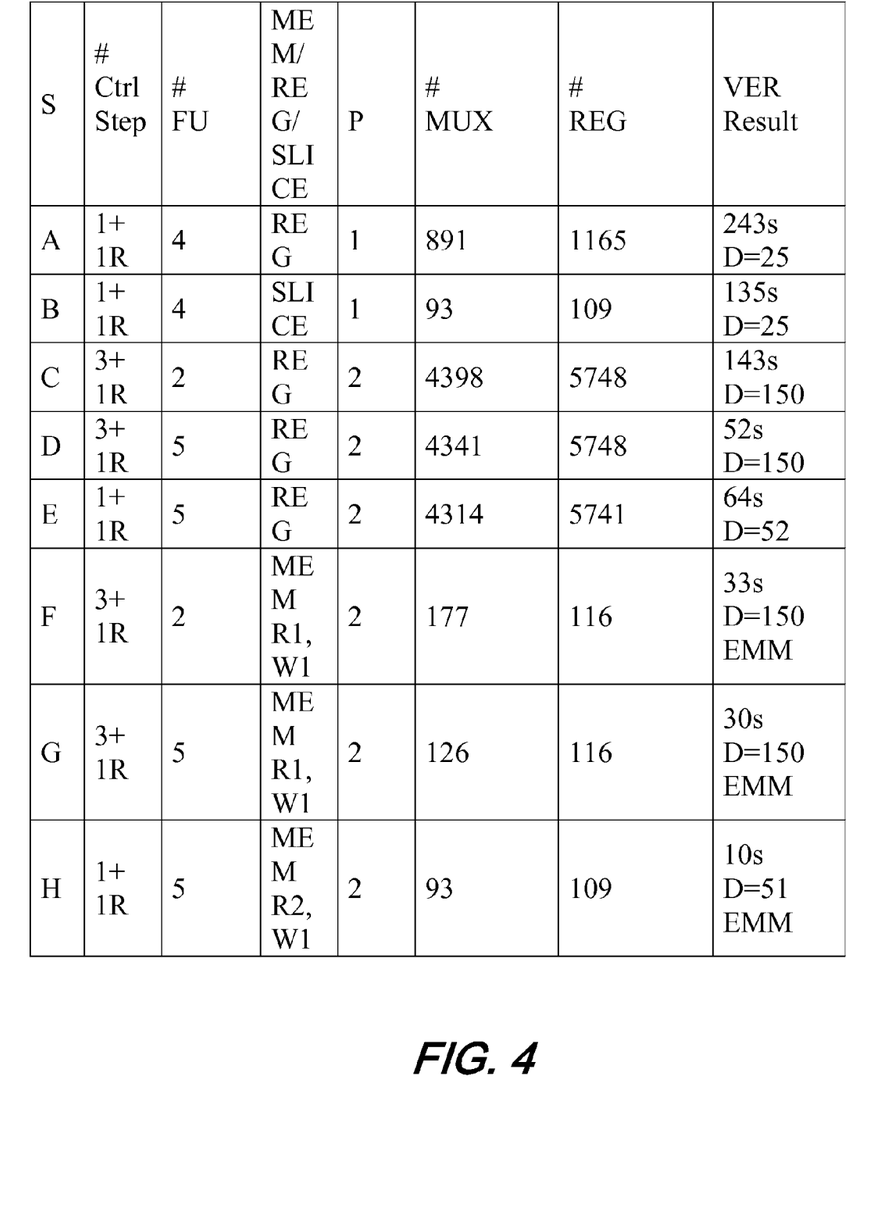
FIG. 4 is a schematic diagram depicting the relationship of a verification model according to the present invention as compared with prior-art verification models and their relationships to an original design and an implementation model.
Figure 5:
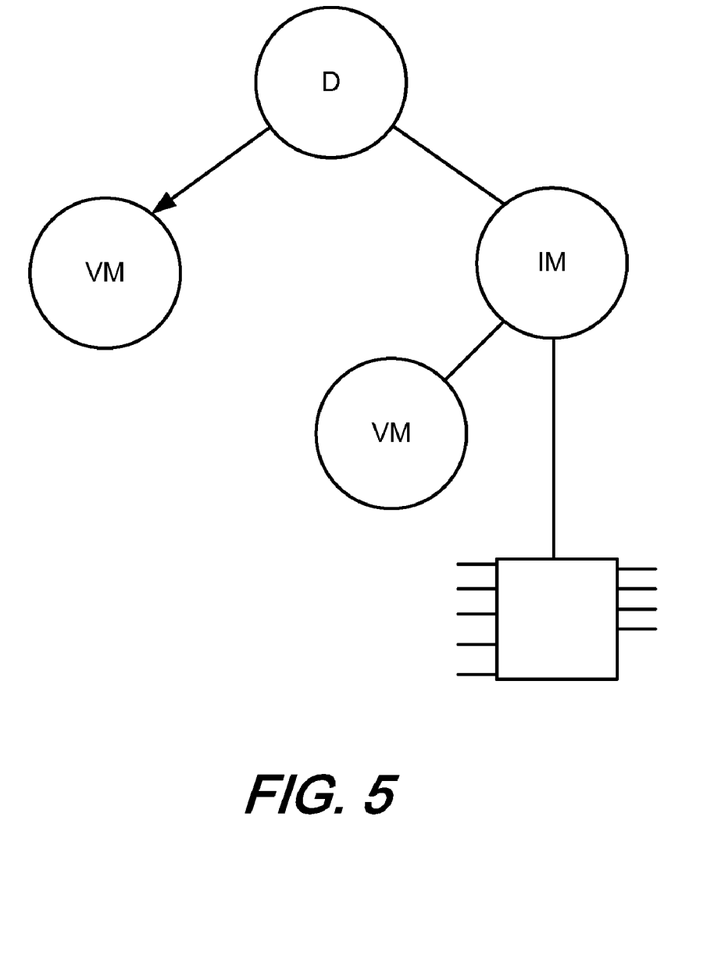

Turning now to FIG. 4, there is shown a schematic of the "verification aware" design methodology which is the subject of the present invention and its comparison to present methodologies. More particularly—with prior methodologies—a design 500 is converted to a verification model 510 which is quite distinct from an implementation model 530 and actual physical implementation 540. Accordingly, and as can surely be appreciated by those skilled in the art, our inventive technique uses existing high level synthesis tools to generate "verification aware" models 530 whose requirements may not overlap with existing design constraints i.e. area, power and speed.

Figure 3:
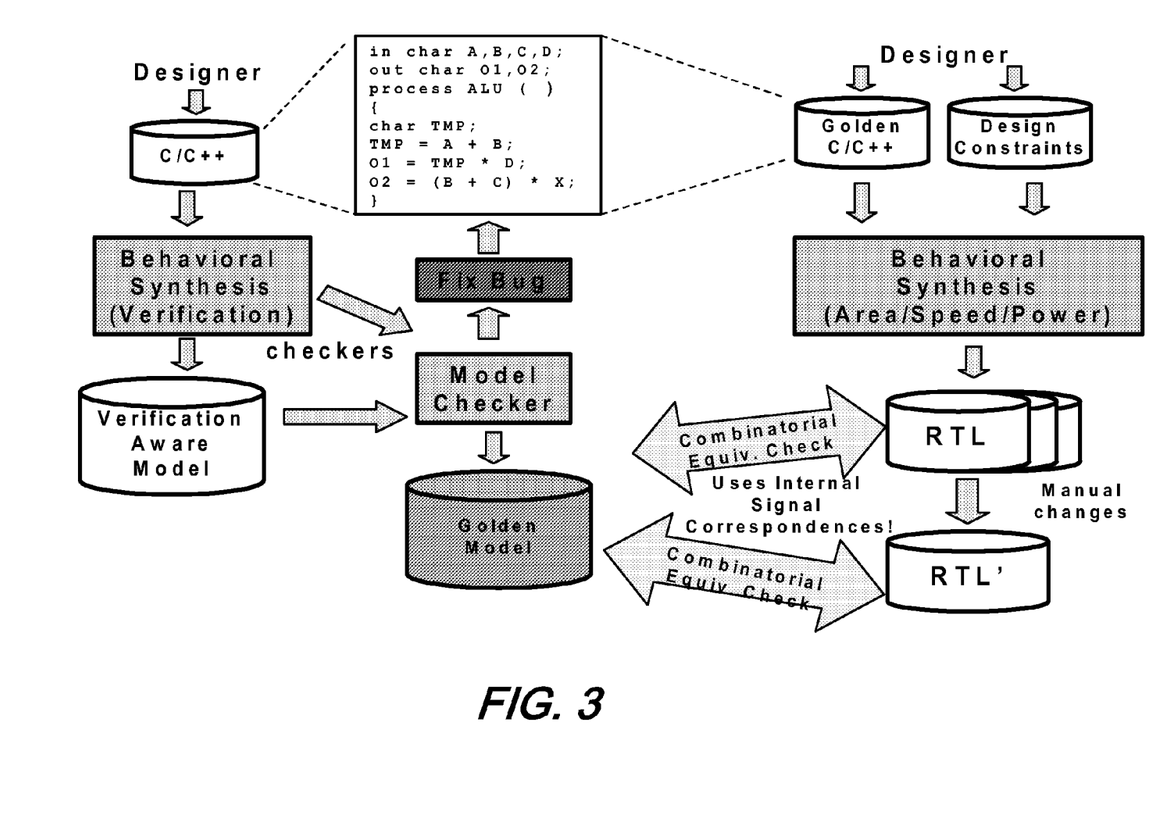
FIG. 3 is a schematic diagram showing High-Level Synthesis for Verification according to the present invention.

According to the present invention—within an existing infrastructure of HLS—verification friendly models (specific to SAT-based FV tools) are generated from a given high-level design: More particularly, our approach is counter-intuitive in that when constructing the model it encourages 1) No re-use of functional units and registers; 2) Minimize the use of muxes and sharing; 3) Reduce the number of control steps; 4) Avoid pipelines; 5) Chose functional units from "verification friendly" library; 6) Re-use operations; 7) Perform property-preserving slicing support "assume" and "assert" in the language specification; 8) Use external memory modules instead of register arrays As shown in FIG. 3, the verification can then be carried out on the friendly model to obtain a "golden" reference model that satisfies all the properties under consideration. Accordingly, as HLS synthesizes both "verification aware" and "design-constraints satisfying" models, it can easily keep track of the correspondence between the internal signals of the two models. This information subsequently can be used by a combinational or "bounded sequential" equivalence checker tool to validate the correctness of the design (that might have been manually changed to meet design constraints) against the "golden reference model".

At this point, while we have discussed and described our invention using some specific examples, those skilled in the art will recognize that our teachings are not so limited. Accordingly, our invention should be only limited by the scope of the claims attached hereto.

The invention claimed is:

1. A computer-implemented method of verifying computer software comprising the steps of:
    generating a verification aware model of the software using High-Level Synthesis (HLS) tools including the steps of:
        prioritizing any HLS criteria wherein the criteria include: timing, area, power and verification performance; and
        assigning the highest priority to the verification performance criteria irrespective of any effect that assignment has on the other criteria;
    verifying the generated model using a formal verification methodology; and
    outputting an indicia of correctness of the software resulting from the model verification.

2. The computer-implemented method of claim 1 wherein the generated model exhibits no re-use of functional units and registers.

3. The computer-implemented method of claim 1 wherein the generated model exhibits a minimal use of muxes and sharing.

4. The computer-implemented method of claim 1 wherein the generated model exhibits a reduced number of control steps.

5. The computer-implemented method of claim 1 wherein the generated model exhibits limited pipeline usage.

6. The computer-implemented method of claim 1 wherein the generated model uses external memory modules instead of register arrays.

7. The computer-implemented method of claim 1 wherein the generated model has a reduced number of reachable control states at each depth.

* * * * *